(12) United States Patent
Kokubun

(10) Patent No.: US 6,635,915 B2
(45) Date of Patent: Oct. 21, 2003

(54) SEMICONDUCTOR DEVICE HAVING TRENCH CAPACITOR FORMED IN SOI SUBSTRATE

(75) Inventor: Koichi Kokubun, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/178,749

(22) Filed: Jun. 25, 2002

(65) Prior Publication Data

US 2002/0195637 A1 Dec. 26, 2002

(30) Foreign Application Priority Data

Jun. 26, 2001 (JP) .................................. 2001-193323

(51) Int. Cl.$^7$ ............................................. H01L 27/108

(52) U.S. Cl. .......................... 257/301; 257/349; 257/71; 257/68

(58) Field of Search ............................ 257/57, 301–303, 257/329, 350, 349, 68, 71

(56) References Cited

U.S. PATENT DOCUMENTS 5,525,531 A     6/1996  Bronner et al.
6,333,532 B1 * 12/2001  Davari et al. ............... 257/301

* cited by examiner

Primary Examiner—Carl Whitehead, Jr.
Assistant Examiner—Yennhu B Huynh
(74) Attorney, Agent, or Firm—Oblon, Spivak, McClelland, Maier & Neustadt, P.C.

(57) ABSTRACT

A semiconductor device comprises an SOI substrate, a trench, a trench capacitor, and a conductive layer. The SOI substrate includes a fist semiconductor region, a buried insulating film formed on the first semiconductor region, and a second semiconductor region formed on the buried insulating film. The trench is of a depth to reach the first semiconductor region, extending from a surface of the second semiconductor region on the SOI substrate and passing through the buried insulating film. The trench capacitor is formed within the trench. The conductive layer is formed in a region between a sidewall portion of the trench and the buried insulating film, and electrically connects the first semiconductor region and the second semiconductor region.

3 Claims, 4 Drawing Sheets

SEMICONDUCTOR DEVICE HAVING TRENCH CAPACITOR FORMED IN SOI SUBSTRATE

CROSS-REFERENCE TO RELATED APPLICATIONS

This application is based upon and claims the benefit of priority from the prior Japanese Patent Application No. 2001-193323, filed Jun. 26, 2001, the entire contents of which are incorporated herein by reference.

BACKGROUND OF THE INVENTION

1. Field of the Invention

The present invention relates generally to a semiconductor device and a method of manufacturing the same, and more specifically to an SOC (System On Chip) technique for combining a DRAM device having a memory cell with a trench capacitor structure and a logic device on an SOI (Silicon On Insulator) substrate.

2. Description of the Related Art

With the developments in information communication technologies in recent years, in a semiconductor device which performs, e.g., image processing, the SOC technique for combining a DRAM device and a logic device in a single chip is desired in order to achieve high-speed data transfer between a memory and a logic circuit. It is one of the weighty SOC techniques to apply the SOI technique, which can realize a high-speed and low-power-consumption logic device, to the DRAM device.

FIG. 1 is a cross-sectional view schematically showing a memory cell formed when a DRAM having a memory cell with a trench capacitor structure is manufactured by an SOI technique. Specifically, FIG. 1 illustrates a conventional semiconductor device and a method of manufacturing the same. The memory cell is provided in an SOI substrate 11. The SOI substrate 11 includes a BOX (Buried Oxide) film 11-3 formed between a semiconductor region (substrate) 11-1 at a plate side and a semiconductor region (P-well region) 11-2 at an element region side. Specifically, the SOI substrate 11 is provided with a trench (deep trench) 12 with a depth to reach the substrate 11-1, extending from the P-well region 11-2 and passing through the BOX film 11-3. A capacitor (trench capacitor) 13 is formed within the trench 12. A cell transistor 14 for selecting the capacitor 13 is formed on the P-well region 11-2 in a state where one of source and drain regions 15, 16 of the transistor 14 is connected to one electrode of the cell capacitor 13.

However, with the above structure, since the P-well region 11-2 and the substrate 11-1 are electrically insulated by the BOX film 11-3, the P-well region 11-2 is in a floating state. This causes a problem that the channel potential of the cell transistor 14 cannot be controlled, and the operation becomes unstable.

BRIEF SUMMARY OF THE INVENTION

According to an aspect of the present invention, there is provided a semiconductor device comprising: an SOI substrate including a first semiconductor region, a buried insulating film formed on the first semiconductor region, and a second semiconductor region formed on the buried insulating film; a trench with a depth to reach the first semiconductor region, extending from a surface of the second semiconductor region in the SOI substrate and passing through the buried insulating film; a trench capacitor formed within the trench; and a conductive layer formed in a region between a sidewall portion of the trench and the buried insulating film, the conductive layer electrically connecting the first semiconductor region and the second semiconductor region.

According to another aspect of the present invention, there is provided a method of manufacturing a semiconductor device, comprising: forming a trench in an SOI substrate, the trench extending from a major surface of the SOI substrate and passing through a buried insulating film; forming a first insulating film in the trench, the first insulating film with a depth to reach an upper surface of the buried insulating film; forming a second insulating film in a sidewall portion of the trench above the first insulating film, the second insulating film made of a material different from that of the first insulating film; etching back the first insulating film to such a depth as to reach an upper surface of the buried insulating film, using the second insulating film as a mask, and recessing the buried insulating film exposed to the sidewall portion of the trench; forming a semiconductor layer by epitaxial growth in a gap created by the recessed buried insulating film; and removing the first insulating film and the second insulating film and forming a trench capacitor in the trench.

According to still another aspect of the present invention, there is provided a method of manufacturing a semiconductor device, comprising: forming a trench in an SOI substrate, the trench extending from a major surface of the SOI substrate and passing through a buried insulating film; forming a first insulating film in the trench, the first insulating film with a depth to reach an upper surface of the buried insulating film; forming a second insulating film in a sidewall portion of the trench above the first insulating film, the second insulating film made of a material different from that of the first insulating film; etching back the first insulating film to such a depth as to reach an upper surface of the buried insulating film, using the second insulating film as a mask, and recessing the buried insulating film exposed to the sidewall portion of the trench; depositing a polysilicon layer on a major surface of the SOI substrate and in the trench; etching back the polysilicon layer by performing anisotropy etching to cause the polysilicon layer to remain in a gap created by the recessed buried insulating film in the trench; and removing the first insulating film and the second insulating film and forming a trench capacitor in the trench.

DETAILED DESCRIPTION OF THE INVENTION

Figure 1:
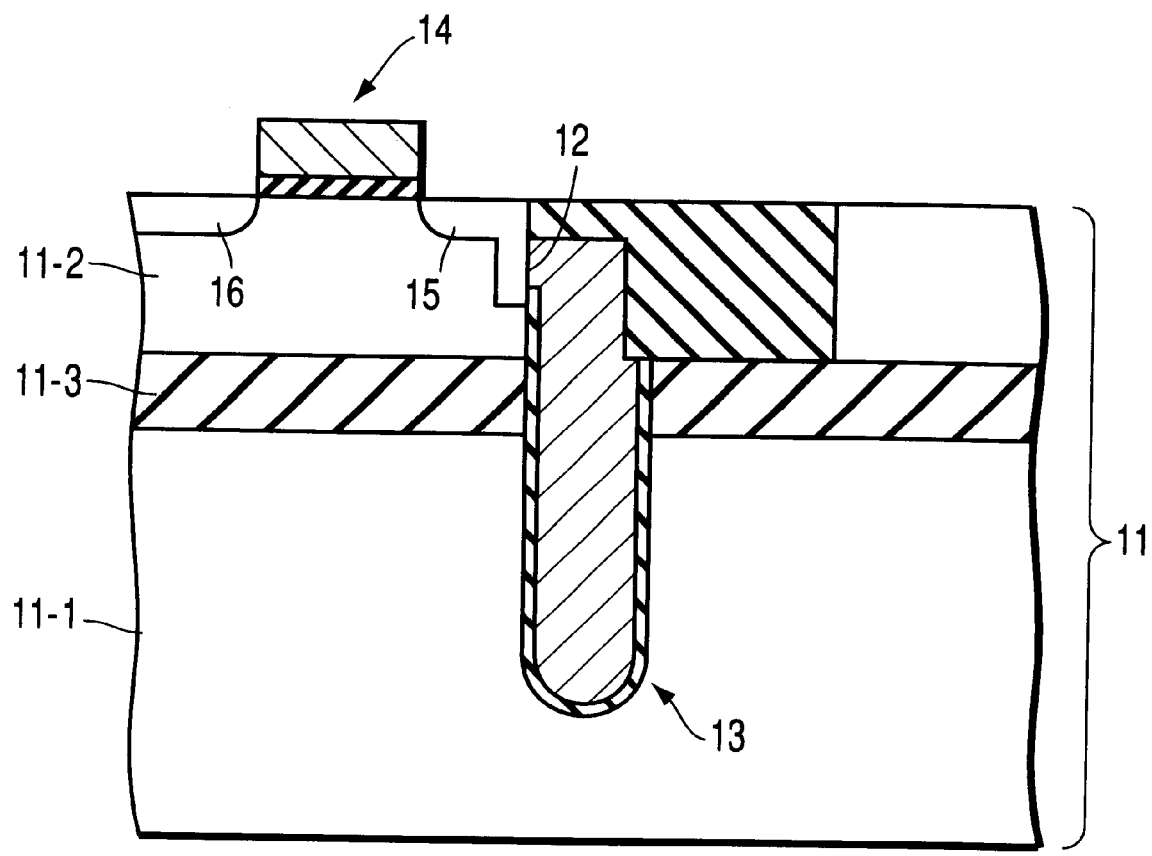
FIG. 1 is a cross-sectional view schematically showing a memory cell formed when a DRAM having a memory cell with a trench capacitor structure is manufactured by an SOI technique, for illustrating a conventional semiconductor device and a method of manufacturing the same.
Figure 2:
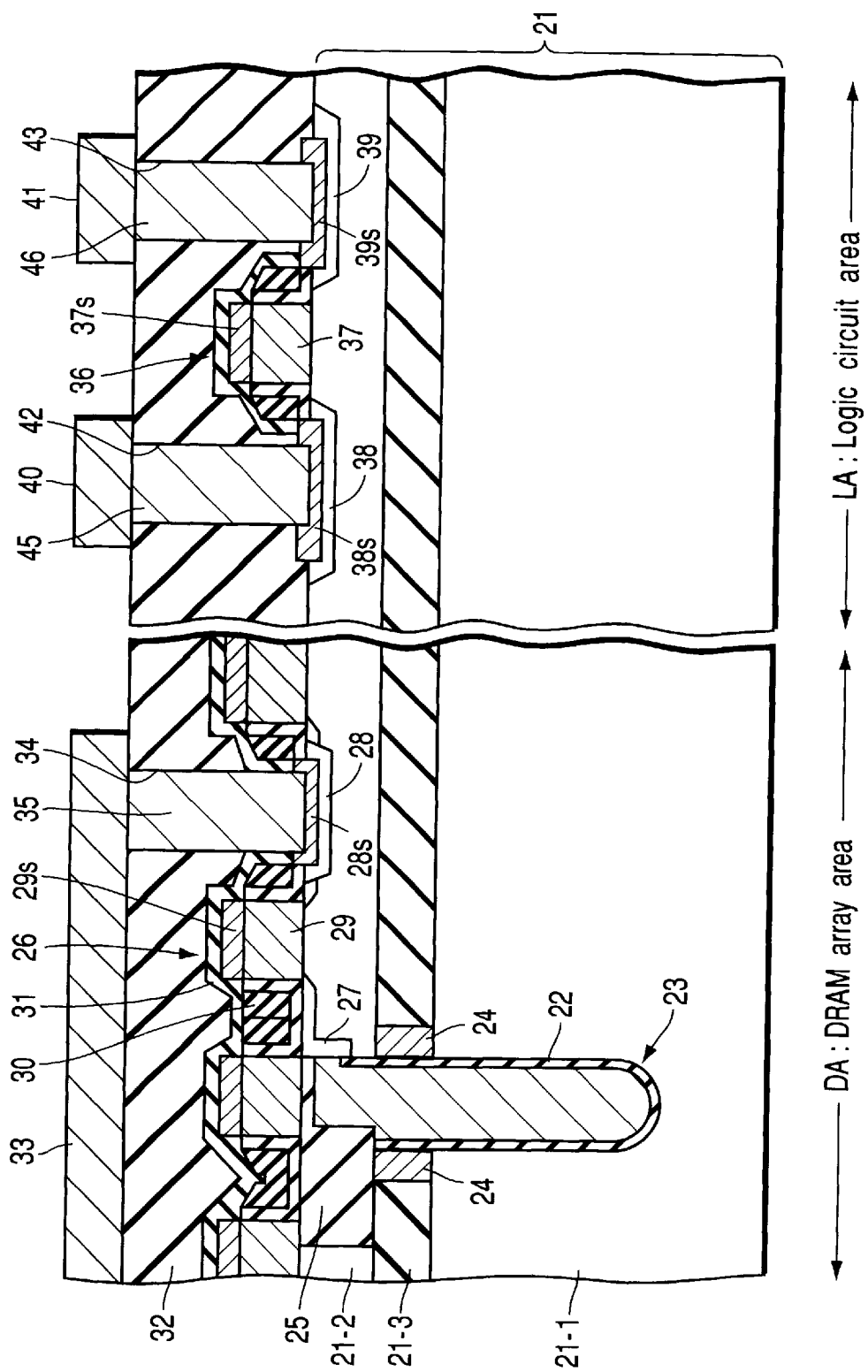
FIG. 2 is a cross-sectional view showing a semiconductor device to which an SOC technique for combining a DRAM device and a logic device on an SOI substrate is applied, for illustrating a semiconductor device and a method of manufacturing the same according to an embodiment of the present invention.

FIG. 2 is a cross-sectional view showing a part of a semiconductor device to which an SOC technique for combining a DRAM device and a logic device on an SOI substrate is applied. Specifically, FIG. 2 illustrates a semiconductor device and a method of manufacturing the same according to an embodiment of the present invention.

As shown in FIG. 2, the semiconductor device has a DRAM array area DA and a logic circuit area LA. A DRAM memory cell and a logic circuit are integrally formed in an SOI substrate 21. In the SOI substrate 21, an oxide film as a buried insulating film (BOX (Buried Oxide) film) 21-3 is formed between a first semiconductor region (substrate) 21-1 at a plate side and a second semiconductor region (P-well region) 21-2 at an element region side.

A trench (deep trench) 22 is formed in the DRAM array area DA of the SOI substrate 21. The trench 22 is of a depth to reach the substrate 21-1, extending from the P-well region 21-2 and passing through the BOX film 21-3, for example, 6 $\mu$m to 8 $\mu$m. A cell capacitor (trench capacitor) 23 that forms the DRAM memory cell is provided within the trench 22. A conductive material for electrically connecting the substrate 21-1 and the P-well region 21-2, for example, a silicon layer or a polysilicon layer (conductive layer) 24, is formed between a sidewall portion of the trench 22 and the BOX film 21-3.

An element isolation region 25 of an STI (Shallow Trench Isolation) structure is formed in an upper portion of the trench 22, thus element isolation is obtained. A source region (N$^-$ type diffusion layer) 27 of a cell transistor 26 is connected to one electrode of the cell capacitor 23. The cell transistor 26 and the cell capacitor 23 form the DRAM memory cell. Silicide layers, for example, cobalt silicide layers 29s, 28s are formed respectively on a gate electrode (N$^+$ type polysilicon layer) 29 and a drain region (N$^+$ type diffusion layer) 28 of the cell transistor 26, by a Salicide (self aligned silicide) technique. The gate electrode 29 serves as a word line. An SiN layer 30 is provided in a region between the adjacent gate electrodes of the cell transistor. The cobalt silicide layer 29s and the SiN layer 30 are covered with a plasma SiN layer 31. An interlayer insulating film 32 made of BPSG, etc., is formed on the SiN layer 31. A bit line 33 made of aluminum, etc., is provided on the interlayer insulating film 32 to extend in a direction crossing the word line. The bit line 33 comes into contact with the cobalt silicide layer 28s through a contact plug 35 which is made of tungsten, etc., and buried in a via hole 34 formed in the interlayer insulating film 32. Thereby, the drain region 28 of the cell transistor 26 is connected to the bit line 33.

On the other hand, a transistor 36 for a logic circuit to be formed in the logic circuit area LA is manufactured by the same process as that of the transistor 26 which forms the memory cell, and has a similar structure. That is, cobalt silicide layers 37s, 38s, 39s are formed respectively on a gate electrode 37, a source region 38 and a drain region 39 of the transistor 36, by a Salicide technique. The cobalt silicide layer 37s is covered with the SiN layer 31. The interlayer insulating film 32 is formed on the SiN layer 31. A source electrode 40 and a drain electrode 41 made of aluminum, etc., are formed on the interlayer insulating film 32. The source electrode 40 and the drain electrode 41 come into contact with the cobalt silicide layers 38s, 39s through contact plugs 45, 46 which are made of tungsten, etc., and buried in via holes 42, 43 formed in the interlayer insulating film 32. The source and drain electrodes 40, 41 are electrically connected to the source and drain regions 38, 39, respectively.

According to the above structure, since the P-well region 21-2 and the substrate 21-1 are electrically connected by a conductive material such as silicon or polysilicon, the P-well region 21-2 can be prevented from being in a floating state. Thus, the operation of the cell transistor can be stabilized.

In FIG. 2, an example to which the Salicide technique is applied in order to enhance the operation speed by reducing sheet resistance of the transistor 36 in the logic circuit area LA is explained. However, the above is not an indispensable structure, and the silicide layer may be omitted.

Figure 3A:
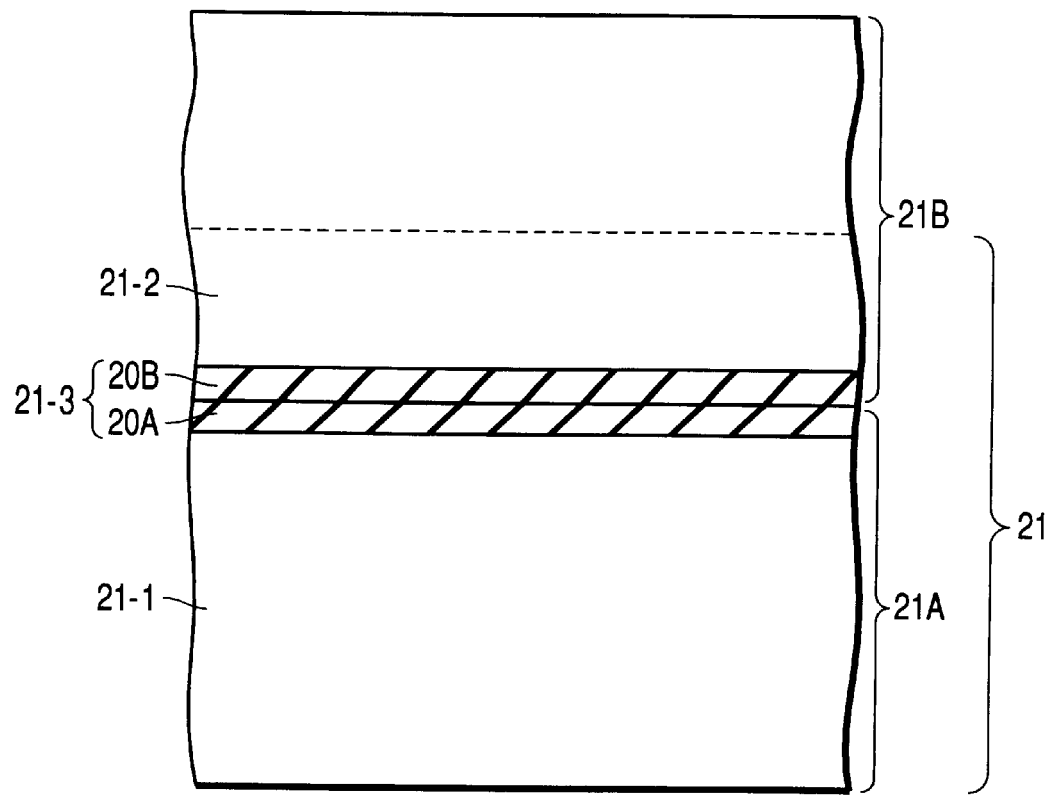
FIGS. 3A to 3E are cross-sectional views illustrating, in order, manufacturing processes of the semiconductor device DRAM array area shown in FIG. 2.

Next, with reference to FIGS. 3A to 3E, a method of manufacturing a vicinity region of the cell capacitor (trench capacitor) 23 in the DRAM array area DA having the structure as above will be explained. First, an SOI substrate 21 is formed using a semiconductor substrate bonding technique, for example. Specifically, as shown in FIG. 3A, two semiconductor substrates (silicon substrates) 21A, 21B having oxide films 20A, 20B formed on one surface thereof are prepared. After bonding the oxide films 20A, 20B formation surface sides of the substrates to each other, heat treatment is performed to combine the two semiconductor substrates 21A and 21B. Thereby, a composite substrate is formed. After that, one surface side of the bonded substrate, which is to be the P-well region 21-2, is ground and polished away to the point indicated by a broken line to have a thin thickness. Thereby, the SOI substrate 21 is formed comprising the semiconductor substrate 21A as a first semiconductor region (substrate) 21-1, the remaining region of the semiconductor substrate 21B as a second semiconductor region (P-well region) 21-2, and the oxide films 20A, 20B as a BOX film 21-3.

Figure 3B:
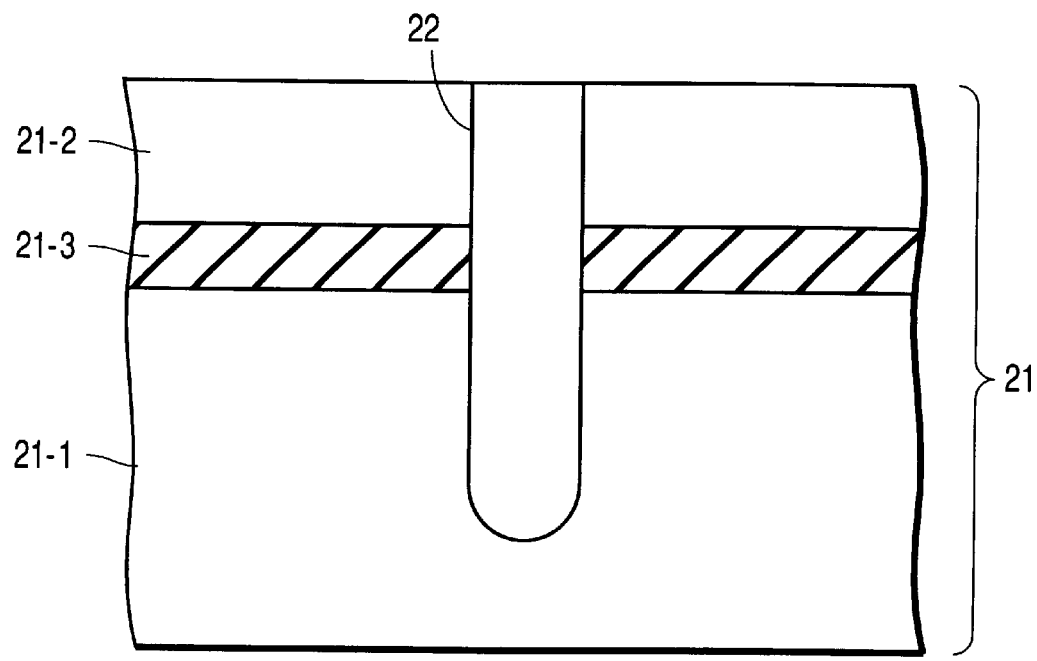

Next, as shown in FIG. 3B, using an anisotropy etching technique such as RIE, etc., a trench 22 for a cell capacitor with a depth of 6 $\mu$m to 8 $\mu$m to reach the substrate 21-1, extending from the P-well region 21-2 and passing through the BOX film 21-3, is formed.

Figure 3C:
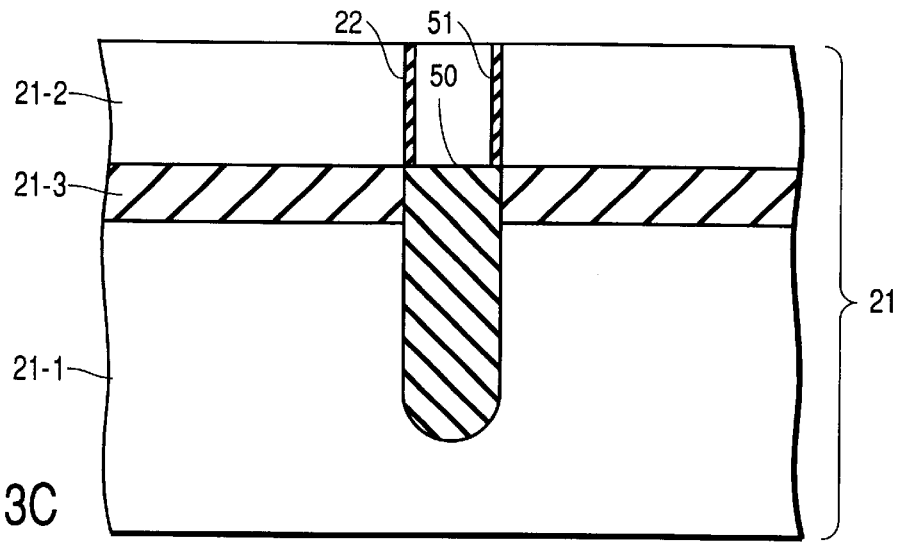

An insulating film (e.g. silicon oxide film) 50 is then deposited on the entire surface. Afterwards, the insulating film 50 is removed by wet etching to the depth of the upper portion of the BOX film 21-3, as shown in FIG. 3C. Thereby, the bottom portion of the trench 22 is buried by the insulating film 50. An insulating film (e.g. NO film, SiN) 51 different from the insulating film 50 is then deposited. Only the part of the film 51 on the insulating film 50 is removed by RIE.

Figure 3D:
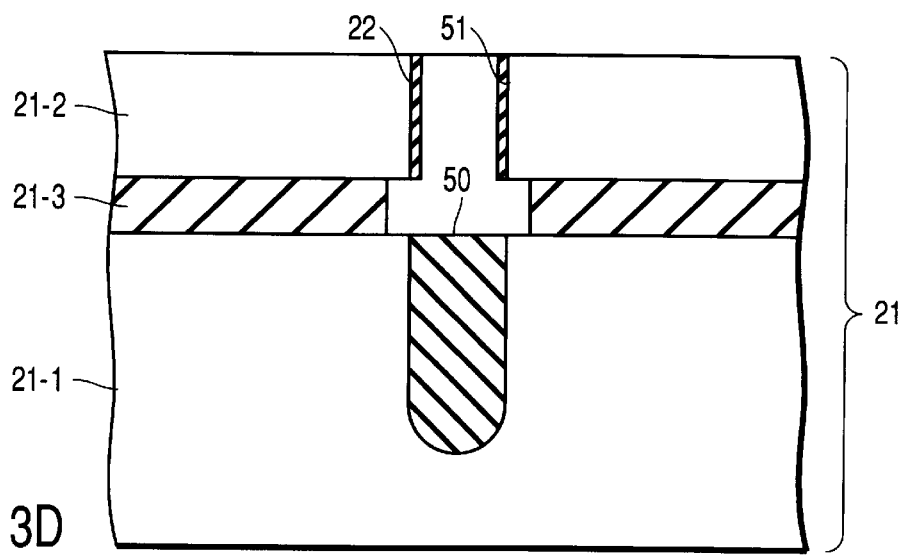

After that, the insulating film 50 is removed by etching to the lower portion of the BOX film 21-3. At this time, the BOX film 21-3 is also recessed by etching, as shown in FIG. 3D.

Figure 3E:
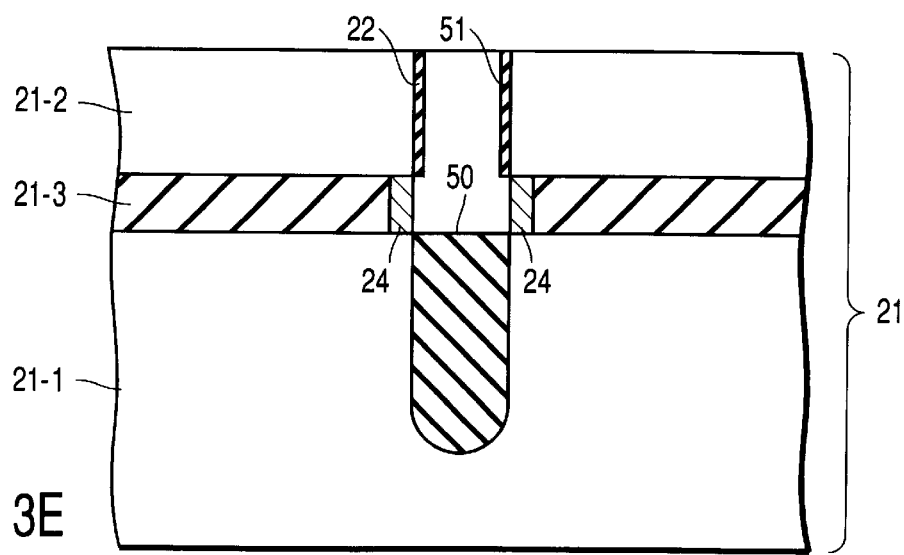

Next, as shown in FIG. 3E, a silicon layer 24 is formed by epitaxial growth to bury a gap created by the recessed BOX film. At this time, since all portions except the gap portion are insulators, silicon is formed only in the gap portion. Alternatively, a polysilicon layer may be deposited within the trench 22 and anisotropy etching such as RIE, etc., may be performed, thereby providing polysilicon only in the gap created by the recessed BOX film 21-3.

The insulating films 50 and 51 remaining within the trench 22 are then removed, and a cell capacitor 23 is formed by a well-known manufacturing process. Semiconductor devices such as a transistor, etc., are formed on the areas except the capacitor 23, using the manufacturing process common to DRAM array area DA and logic circuit area LA formation. That is, a device structure comprising a DRAM array area and a logic circuit area (or DRAM peripheral circuit area) can be achieved by performing a well-known STI process (formation of the element isolation region 25), transistor formation process, wiring formation process, etc.

According to the manufacturing method as described above, if the cell capacitor 23 is formed in the SOI substrate 21, the P-well region 21-2 and the substrate 21-1 can be electrically connected to each other by the epitaxial layer 24 (or polysilicon layer). Thus, the P-well region 21-2 on which a device is formed can be prevented from being in a floating state. A stable operation of the cell transistor 26 can thus be obtained.

The manufacturing process of the DRAM array area DA and the logic circuit area LA can be simplified if the common structural portions are formed by the same manufacturing process. However, if each of the DRAM portion and logic circuit portion is desired to be provided with optimum device characteristics, both may be formed by separate processes.

As described above, according to one aspect of this invention, a semiconductor device and a method of manufacturing the same can be obtained which can prevent a semiconductor region, on which a device is formed, from being in a floating state, if a trench capacitor is formed in an SOI substrate, and thus can stabilize an operation of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

an SOI substrate including a first semiconductor region, a buried insulating film formed on the first semiconductor region, and a second semiconductor region formed on the buried insulating film, the SOI substrate including a DRAM array region and a logic circuit region:

a trench with a depth to reach the first semiconductor region, extending from a surface of the second semiconductor region of the DRAM array region in the SOI substrate and passing through the buried insulating film;

a trench capacitor formed within the trench;

a first transistor formed within the DRAM array region in the SOI substrate, the first transistor having source and drain regions one of which is connected to one of electrodes of the trench capacitor, and forming a DRAM memory cell together with the trench capacitor;

a gap region formed between a sidewall portion of the trench and the buried insulating film, as a recess of a buried oxide film; and a conductive layer formed to fit in the gap region, electrically insulated from the electrode of the trench capacitor formed within the trench, and electrically connecting the first semiconductor region and the second semiconductor region of the DRAM array region in the SOI substrate.

2. A semiconductor device according to claim 1, further comprising a second transistor formed in the second semiconductor region in the SOI substrate and forming a logic circuit.

3. A semiconductor device according to claim 2, further comprising a silicide layer provided on at least a part of a gate electrode, a source region and a drain region of the second transistor forming the logic circuit.

* * * * *